(12) United States Patent
Endo et al.

(10) Patent No.: US 7,927,972 B2
(45) Date of Patent: Apr. 19, 2011

(54) METHOD FOR PRODUCING BONDED WAFER

(75) Inventors: Akihiko Endo, Tokyo (JP); Tatsumi Kusaba, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 12/384,819

(22) Filed: Apr. 9, 2009

(65) Prior Publication Data
US 2009/0258475 A1 Oct. 15, 2009

(30) Foreign Application Priority Data

Apr. 11, 2008 (JP) ................................. 2008-103062

(51) Int. Cl.
*H01L 21/30* (2006.01)
*H01L 21/46* (2006.01)
(52) U.S. Cl. ............ 438/459; 438/311; 438/474; 438/9; 257/E21.17; 257/E21.32; 257/E21.227; 257/E21.267
(58) Field of Classification Search .............. 438/9, 311, 438/474, 475, 509, 510, 513, 459, 663; 257/E21.17, 257/32, 227, 267
See application file for complete search history.

(56) References Cited

U.S. PATENT DOCUMENTS

| 5,362,667 | A | * | 11/1994 | Linn et al. | 438/459 |
| 5,517,047 | A | * | 5/1996 | Linn et al. | 257/347 |
| 5,849,627 | A | * | 12/1998 | Linn et al. | 438/455 |
| 6,653,209 | B1 | * | 11/2003 | Yamagata | 438/459 |
| 2009/0098707 | A1 | * | 4/2009 | Nishihata et al. | 438/455 |

FOREIGN PATENT DOCUMENTS

| JP | H05-291543 A | 11/1993 |
| JP | 2006-184237 A | 7/2006 |

* cited by examiner

*Primary Examiner* — David Nhu
(74) *Attorney, Agent, or Firm* — Sughrue Mion, PLLC

(57) ABSTRACT

Even if an oxygen ion implanted layer in a wafer for active layer is not a completely continuous $SiO_2$ layer but a layer mixed partially with Si or $SiO_x$, it is removed by here is provided a method for producing a bonded wafer in which it is possible to remove an oxygen ion implanted layer effectively as it is by repetitive treatment with an oxidizing solution and HF solution at a step of removing the oxygen ion implanted layer in a bonded wafer.

4 Claims, 7 Drawing Sheets
(1 of 7 Drawing Sheet(s) Filed in Color)

FIG. 5

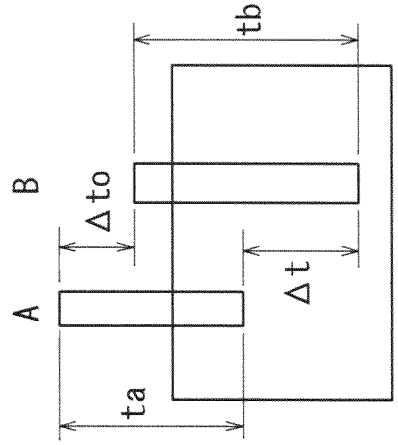

(a) Supposed that the oxygen ion implanted layer is a 100% Si layer ta = tb (Δto = Δt)
Reflects the thickness distribution of ion implanted layer

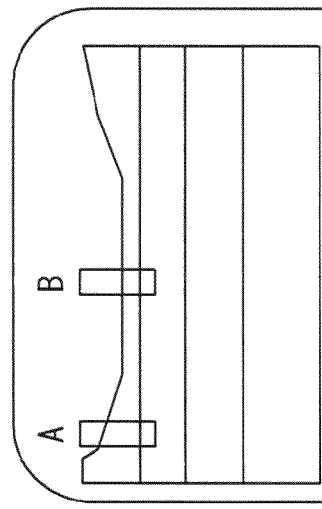

(b) When the oxygen ion implanted layer is a layer mixed with Si and SiO$_2$ (actual case)

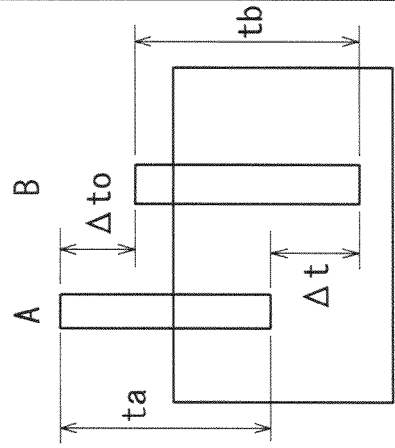

ta ≦ tb (Δto ≦ Δt)
Increases the thickness distribution of ion implanted layer

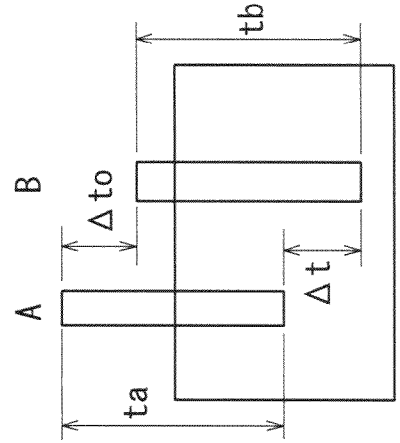

(c) Supposed that the oxygen ion implanted layer is a 100% SiO$_2$ layer ta < tb (Δto < Δt)
Increases the thickness distribution of ion implanted layer

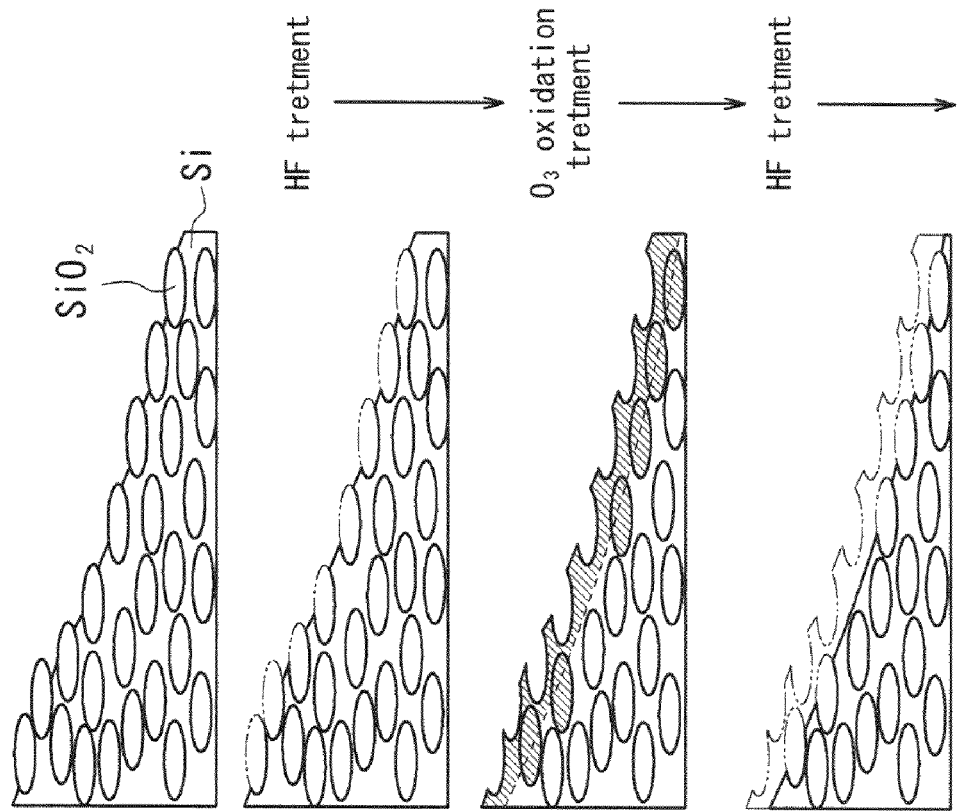
FIG. 6
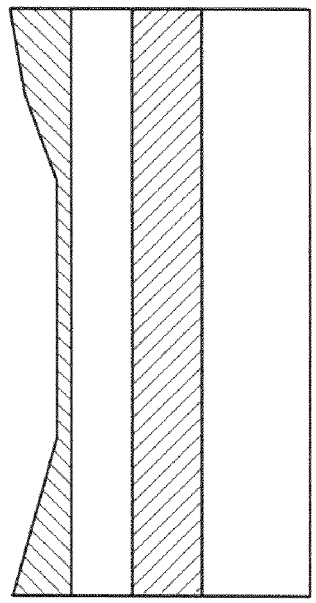

ta > tb (Δto > Δt), the thickness distribution
of ion implanted layer can be decreased

METHOD FOR PRODUCING BONDED WAFER

CROSS-REFERENCE TO RELATED APPLICATIONS

This application claims priority from Japanese Patent Application No. 2008-103,062, filed Apr. 11, 2008 in the Japan Patent Office.

BACKGROUND OF THE INVENTION

1. Field of the Invention

This invention relates to a method for producing a bonded wafer, and is especially directed to advantageously improve an in-plane thickness uniformity of an SOI layer.

2. Description of the Related Art

As a typical method of producing a bonded wafer, there are known a method wherein a silicon wafer provided with an oxide film (insulating film) is bonded to another silicon wafer and then one side of the resulting bonded wafer is ground and polished to form an SOI layer (grinding-polishing method), a method wherein oxygen ions are implanted into an interior of a silicon wafer and thereafter a high-temperature annealing is conducted to form a buried oxide film in the silicon wafer and then an upper portion of the oxide film is rendered into an SOI layer (SIMOX), and a method wherein ions of hydrogen or the like are implanted into a surface layer portion of a silicon wafer for SOI layer (wafer for active layer) to form an ion implanted layer and thereafter the wafer is bonded to a silicon wafer for support substrate and then the bonded wafer is exfoliated at the ion implanted layer through a heat treatment to form an SOI layer (smart cut method), and so on.

Among the aforementioned methods, however, the grinding-polishing method has a problem that the thickness uniformity of the active layer (SOI layer) is poor (±30% or more). On the other hand, the method using oxygen ion implantation (SIMOX) has a problem that it is impossible to produce SOI structures having different crystal orientation through the insulating layer.

As a solution for the above problems, the inventors have already developed a process combining the oxygen ion implanting method with the grinding-polishing method and disclosed in JP-A-H05-291543.

As another process combining the oxygen ion implanting method with the grinding-polishing method, there has been proposed a production method of a bonded wafer having the following construction in Japanese Patent Application No. 2006-184237:

"A method for producing a bonded wafer by directly bonding a wafer for active layer having or not having an insulating film on its surface to a wafer for support layer and then thinning the wafer for active layer, which comprises a time-oriented combination of:

a step of implanting oxygen ions into the wafer for active layer to form an oxygen ion implanted layer in the active layer;

a step of subjecting the wafer for active layer to a heat treatment at a temperature of not lower than 1100° C. in a non-oxidizing atmosphere;

a step of bonding the wafer for active layer to a wafer for support layer;

a step of heat-treating for improving a bonding strength;

a step of grinding a portion of the wafer for active layer in the bonded wafer short of the oxygen ion implanted layer;

a step of further polishing or etching the wafer for active layer to expose the oxygen ion implanted layer;

a step of oxidizing the bonded wafer to form an oxide film on the exposed surface of the oxygen ion implanted layer;

a step of removing the oxide film; and a step of heat-treating at a temperature of not higher than 1100° C. in a non-oxidizing atmosphere."

By such a combined method, it is made possible to directly provide a bonded wafer being excellent in the thickness uniformity of the active layer and relatively less in the defects as evaluated by a transmission electron microscope (TEM).

SUMMARY OF THE INVENTION

However, the above method combining the oxygen ion implanting method with the grinding-polishing method has still the following problems.

(1) Polishing Stop (Polish-Stop) or Etching Stop (Etch-Stop)

It is possible to conduct the stop treatment at the oxygen ion implanted layer by appropriately selecting the oxygen ion implantation amount and/or the heat treatment condition for increasing the bonding strength. However, the polishing causes a problem in its fabrication accuracy, while in case of the etching stop, there is a risk that a part of the oxygen ion implanted layer is thinned depending on the selective ratio of Si to $SiO_2$.

(2) Removal of Oxygen Ion Implanted Layer

If the oxygen ion implantation and the heat treatment are simplified for reducing production cost, the oxygen ion implanted layer is not a completely continuous $SiO_2$ layer, but is a layer partially mixed with Si or $SiO_x$. Therefore, the oxygen ion implanted layer cannot be removed with HF solution usually used for removing $SiO_2$ layer (oxide film).

Currently, there is adopted a method wherein the oxygen ion implanted layer is oxidized by a heat treatment in an oxidizing atmosphere and then removed with HF solution. In this method, however, the thickness distribution is further deteriorated after the stop treatment, and hence the good thickness distribution could not been necessarily obtained at a TopSi layer of a final product.

It is, therefore, an object of the invention to advantageously solve the above problems and to propose an advantageous method for producing a bonded wafer in which it is possible to effectively remove an oxygen ion implanted layer as it is even if the oxygen ion implanted layer is not a completely continuous $SiO_2$ layer but is a layer partially mixed with Si or $SiO_x$.

The inventors have made various studies in order to solve the above problems and obtained the following knowledge.

(1) Even if the oxygen ion implanted layer is a layer mixed with Si and $SiO_2$, it can be removed by alternately and repeatedly using a solution oxidizing silicon (e.g. ozone water, nitric acid or hydrogen peroxide solution) and an HF solution as a liquid for removing the oxygen ion implanted layer.

(2) The thickness distribution in the stop step can be improved by the repetitive treatment with the above oxidizing solution and HF solution.

The invention is based on the above knowledge.

That is, the summary and construction of the invention are as follows.

1. A method for producing a bonded wafer by bonding a wafer for active layer to a wafer for support layer with or without an insulating film and then thinning the wafer for active layer, which comprises a series of:

(1) a step of implanting oxygen ions into a wafer for active layer;

(2) a step of bonding the wafer for active layer to a wafer for support layer directly or with an insulating film;

(3) a step of thinning the wafer for active layer in the bonded wafer to expose the oxygen ion implanted layer;

(4) a step of removing the oxygen ion implanted layer in the wafer for active layer, and (5) a step of planarizing and/or thinning the surface of the wafer for active layer by heat treatment and/or polishing, wherein the oxygen ion implanted layer is removed by repetitive treatment with an oxidizing solution and an HF solution in the above step (4).

2. The method for producing a bonded wafer according to the item 1, wherein the oxidizing solution is ozone water or nitric acid.

3. The method for producing a bonded wafer according to the item 1 or 2, wherein a crystal orientation of each wafer face in the bonded wafer is a combination of (100) and (110) or (111).

According to the invention, even if the oxygen ion implanted layer is not a completely continuous $SiO_2$ layer but is a layer partially mixed with Si or $SiO_x$ it can be removed effectively as it is. Also, according to the invention, even if the thickness distribution is deteriorated at the stop step, it can be improved.

BRIEF DESCRIPTION OF THE DRAWINGS

The patent or application file contains at least one drawing executed in color. Copies of this patent or patent application publication with color drawings will be provided by the Office upon request and payment of the necessary fee.

The invention will be described with reference to the accompanying drawings, wherein:

FIG. 5 is a diagrammatic view explaining a reason why the scattering in the thickness of TopSi layer becomes large in thermal oxidization →HF treatment though an oxygen ion implanted layer can be removed;

FIG. 6 is a diagrammatic view explaining a reason why an oxygen ion implanted layer can be effectively removed and a surface irregularity is mitigated by repetition of oxidation treatment and HF treatment.

DESCRIPTION OF THE PREFERRED EMBODIMENTS

The invention will be concretely described below.

Figure 1:
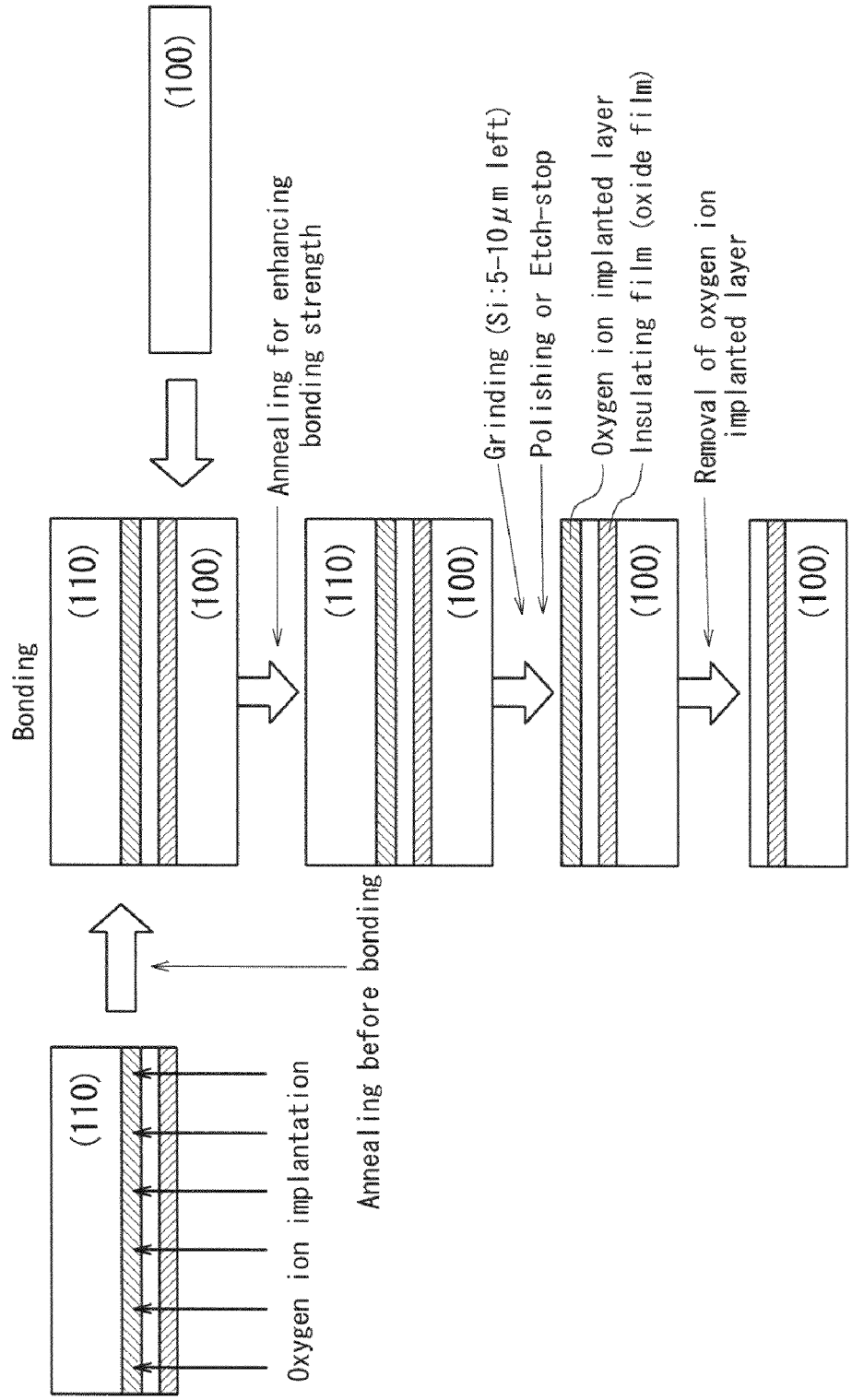
FIG. 1 is a flow chart of production steps according to the invention.

At first, the invention will be concretely described with respect to a wafer substrate to be bonded and each production step of the invention according to a flow chart shown in FIG. 1.

Wafer Substrate

In the production of the bonded wafer, two silicon wafers, i.e. a wafer for active layer and a wafer for support layer are bonded to each other. The invention is applicable to not only a case that the bonding of both wafers is conducted with an insulating film (oxide film) but also a case that both the wafers are directly bonded without such an insulating film.

Moreover, a kind and a concentration of a dopant, an oxygen concentration and the like are not limited as long as the wafer to be bonded has a good surface roughness suitable for bonding. In order to further reduce defects, however, it is preferable to use a wafer having no COP or a less COP. In order to reduce COP, there may be applied a method of reducing COP by optimizing CZ drawing conditions, a method of subjecting a wafer to a high-temperature heat treatment of not lower than 1000° C. in a reducing atmosphere after mirror working, a method of epitaxial-growing Si on a wafer by CVD or the like, and so on.

(1) Step of Implanting Oxygen Ions into a Wafer for Active Layer

In the invention, the acceleration voltage in the oxygen ion implantation may be properly selected depending on the thickness of the active layer in the final product and is not particularly limited. Therefore, the oxygen ion implantation may be carried out at an acceleration voltage of about 100 to 300 keV for a usual oxygen ion implanter. Moreover, it is preferable that the oxygen ion implantation is conducted at two stages.

In the first oxygen ion implantation stage, the dose is preferable to be about $1 \times 10^{16}$ to $5 \times 10^{17}$ atoms/cm$^2$. When the dose in the first oxygen ion implantation stage is less than $1 \times 10^{16}$ atoms/cm$^2$, the formation of $SiO_2$ layer is not sufficient and the polishing stop cannot be conducted properly, while when it exceeds $5 \times 10^{17}$ atoms/cm$^2$, even if the implantation is conducted at a higher substrate temperature, the implantation damage becomes large and the number of surface defects increases. The substrate temperature in the first ion implantation is preferable to be about 200 to 600° C.

In the second oxygen ion implantation stage, the dose is preferable to be about $1 \times 10^{15}$ to $1 \times 10^{16}$ atoms/cm$^2$. When the dose in the second oxygen ion implantation is less than $1 \times 10^{15}$ atoms/cm$^2$, an amorphous layer is not formed sufficiently and the effect of stopping the growth of crystal defects is small, while when it exceeds $1 \times 10^{16}$ atoms/cm$^2$, the whole of the surface layer becomes amorphous and the active layer does not form a single crystal. In the second oxygen ion implantation, the substrate temperature is preferable to be not higher than 300° C.

Furthermore, it is advantageous to conduct the cleaning between the first and second ion implantation stages. Because, particles generated in the first ion implantation stage act as a mask in the second ion implantation stage, and hence ions may not be implanted into downside portions of the particles. As a result, the amorphous formation is not sufficiently conducted in these portions, and there is a risk that the shooting of defects results in a cause of generating the surface defects. Similarly, the first ion implantation may be divided into plural times, and the cleaning may be carried out therebetween. Moreover, as the cleaning means, it is preferable to use SC1, HF, $O_3$ and an organic acid having an excellent performance for removing the particles.

(2) Step of Bonding Wafer for Active Layer to Wafer for Support Layer

Then, the wafer for active layer is bonded to the wafer for support layer. In this case, both the wafers may be bonded to each other with or without an insulating film.

When the bonding is conducted with the insulating film, an oxide film (SiO$_2$), a nitride film (Si$_3$N$_4$) or the like is preferable as an insulating film. As the film formation method are preferable a heat treatment in an oxidizing atmosphere or a nitrogen atmosphere (thermal oxidation, thermal nitriding), CVD and so on. As the thermal oxidation, wet oxidation using steam can be used in addition to the use of oxygen gas. Furthermore, the insulating film may be formed on the frontside substrate before or after the oxygen ion implantation. Also, the formation of the insulating film can be carried out on either the wafer for active layer or the wafer for support layer or both.

As an atmosphere in the bonding is preferable a reducing atmosphere, and in particular Ar, H$_2$ or a mixed atmosphere thereof is advantageously suitable. The heat-treating temperature in the bonding is preferable to be not higher than 1000° C. for suppressing recrystallization of the amorphous layer.

Also, it is advantageous to conduct the cleaning treatment before the bonding in order to suppress the occurrence of voids due to the particles. As the cleaning means, it is effective to use a general method for cleaning silicon wafers with SC1+SC2, HF+O$_3$, an organic acid or a combination thereof.

In addition, it is advantageous that the surface of silicon wafer before the bonding is subjected to an activation treatment with plasma using oxygen, nitrogen, He, H$_2$, Ar or a mixed atmosphere thereof for enhancing the bonding strength.

Furthermore, it is advantageous that the heat treatment for improving the bonding strength is conducted after the above bonding treatment. The heat treatment for improving the bonding strength is preferable to be conducted by keeping a temperature of not lower than 1100° C. for not less than 1 hour in order to sufficiently enhance the bonding strength. An atmosphere in the heat treatment is not particularly limited, but an oxidizing atmosphere is preferable for the formation of an oxide film having a thickness of not less than 150 nm in order to protect the rear face of the wafer at the subsequent grinding step.

(3) Step of Thinning Wafer for Active Layer in Bonded Wafer to Expose Oxygen Ion Implanted Layer In this step, the wafer for active layer in the bonded wafer is first ground by a mechanical work. This grinding is conducted until a part of the wafer for active layer is left on the surface side of the oxygen ion implanted layer. The thickness of the part of the wafer for active layer to be left is not particularly limited.

In order to shorten the time of the subsequent polishing or alkali etching step, it is preferable to conduct the grinding of the wafer for active layer just before the oxygen ion implanted layer. However, considering the precision of the grinding device and the damage depth through the grinding (about 2 µm), the thickness of residual Si film is preferable to be about 5 to 10 µm.

Moreover, the etching with an alkali solution may be conducted instead of the grinding. In this case, in order to avoid the etching of the rear face of the wafer for support layer, it is desirable to form a protection film such as an oxide film or the like on such a rear face.

Subsequently, the wafer for active layer is further polished or etched to expose the oxygen ion implanted layer.

Polishing Process (Polish-Stop)

When the polishing process is utilized as the above treatment for thinning the layer, it is preferable to conduct the polishing while feeding a polishing solution having an abrasive concentration of not more than 1 mass %. As the polishing solution is mentioned an alkaline solution having an abrasive (e.g. silica) concentration of not more than 1 mass %. Moreover, as the alkaline solution is preferable an inorganic alkali solution (KOH, NaOH or the like), an organic alkali solution (for example, piperazine composed mainly of amine, ethylene diamine or the like), or a mixed solution thereof.

In this polishing process, since the abrasive concentration is not more than 1 mass %, the mechanical polishing action with the abrasives is hardly caused, and the chemical polishing action is preferential. Thus, a part (Si layer) of the wafer for active layer is polished by the chemical polishing action with the alkaline solution. Since the etching rate ratio of Si/SiO$_2$ in the alkaline solution is high, the Si layer as a part of the wafer for active layer can be polished efficiently, whereas the SiO$_2$ layer is hardly polished. Even if the mechanical accuracy of the polishing device is insufficient, only the Si layer is polished without substantially polishing the oxygen ion implanted layer, so that the oxygen ion implanted layer can be exposed uniformly.

Moreover, as compared with the following etching process, the merit of the polishing process lies in a point that a thin film layer having an excellent in-plane thickness uniformity can be formed without giving any damage to the Si active layer as a part of the front side silicon wafer isolated by the oxygen ion implanted layer even if the oxygen ion implanted layer is not a completely continuous SiO$_2$ layer.

Etching Process (Etch-Stop)

In the above film thinning treatment, the front side silicon wafer located at the grinding side of the oxygen ion implanted layer can be also removed by using an alkaline etching solution. As the alkaline etching solution is used, for example, KOH, NaOH or the like. If the SiO$_2$ layer formed in the oxygen ion implanted layer is not continuous, a part of the active layer may be etched out by the alkali solution soaked through spaces between SiO$_2$ particles. In order to prevent this phenomenon, it is preferable that the heat treatment before the bonding and/or the heat treatment for enhancing the bonding strength is conducted at a high temperature of not lower than 1300° C. for not less than 5 hours.

Combination of Etching Process and Polishing Process

The oxygen ion implanted layer may be exposed by a combination of the etching process and the polishing process.

In particular, when Si is etched before the polishing, a boundary between a terrace (an outer peripheral region of 1 to 3 mm not bonding two wafers to each other) and the bonded region becomes smooth to suppress the occurrence of particles. Moreover, only the terrace may be polished before the polishing process.

Figure 2:
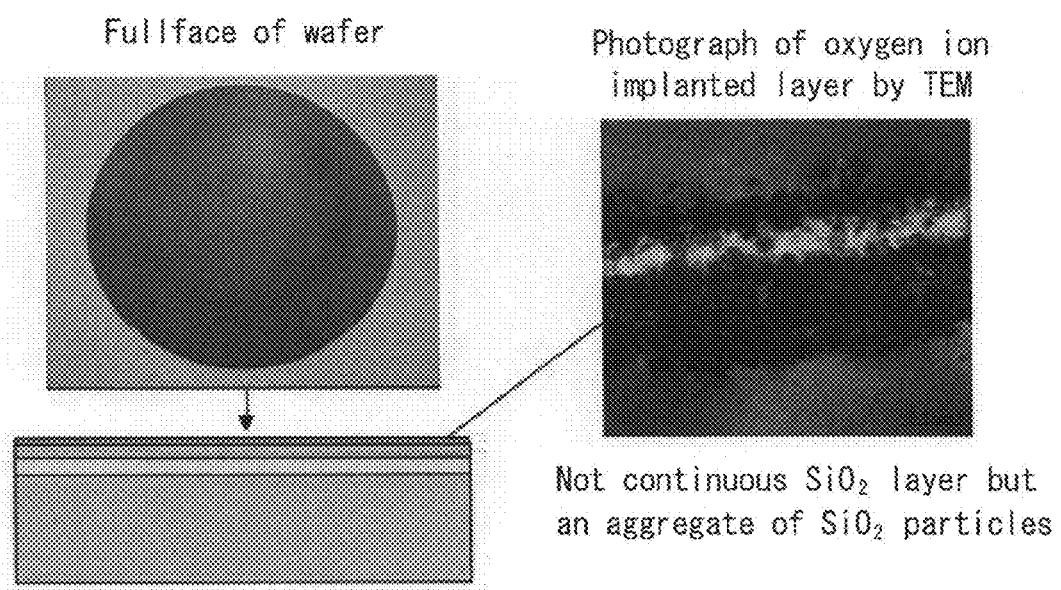
FIG. 2 is a photograph showing a surface of a wafer for active layer after polishing stop.

FIG. 2 shows a surface of the wafer for active layer after the polishing stop. As shown in the FIG. 2, the cross section of the oxygen ion implanted layer exposed by the polish-stop is not a continuous SiO$_2$ layer, but is an aggregate of the SiO$_2$ particles wherein Si is existent between the particles.

(4) Step of Removing Oxygen Ion Implanted Layer in Wafer for Active Layer

The exposed oxygen ion implanted layer is removed after the above polish-stop and/or etch-stop.

Figure 3:
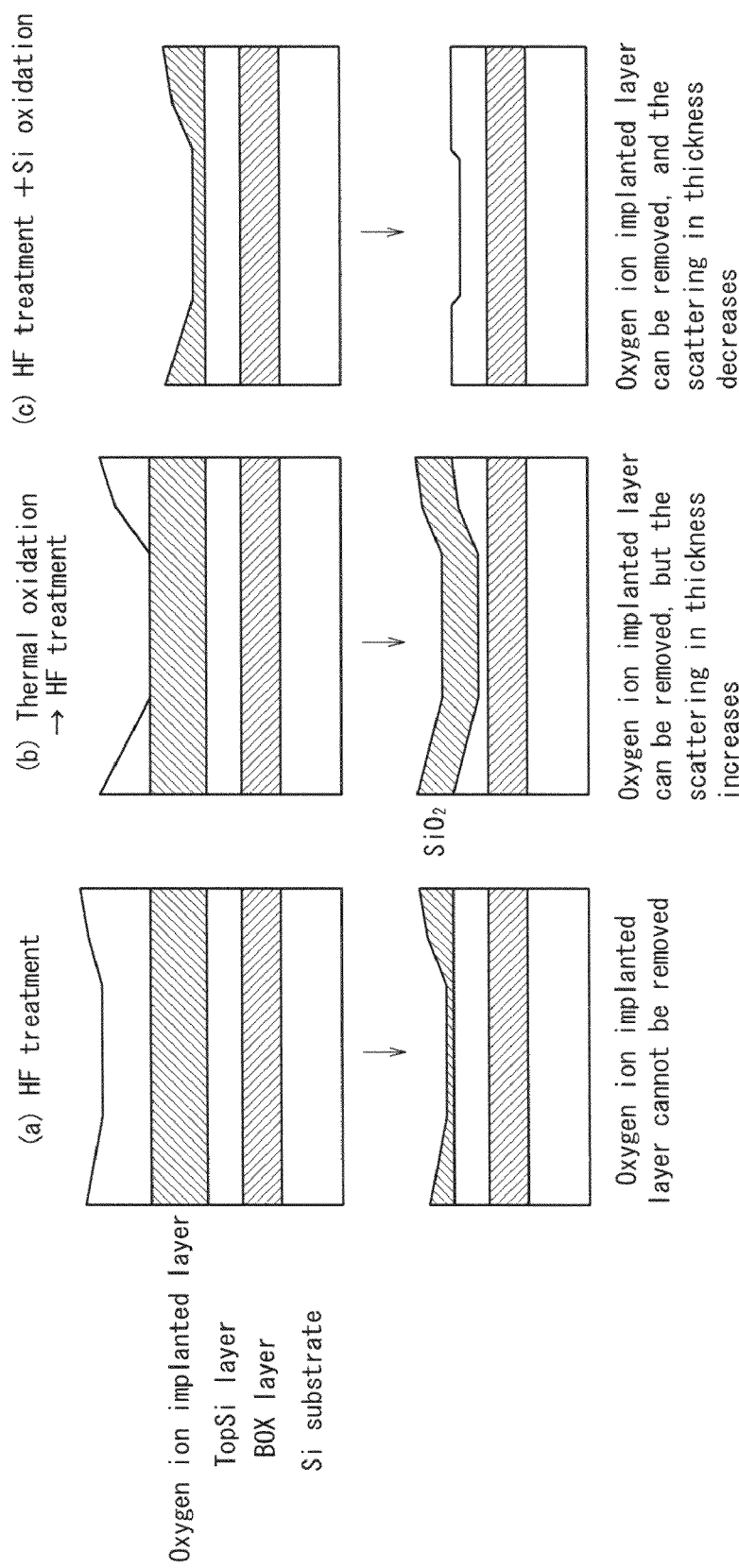
FIG. 3(a) is a diagrammatic view showing a surface nature of a wafer for active layer when an oxygen ion implanted layer is removed by HF treatment.
FIG. 3(b) is a diagrammatic view showing a surface nature of a wafer for active layer when an oxygen ion implanted layer is removed by thermal oxidization →HF treatment.
FIG. 3(c) is a diagrammatic view showing a surface nature of a wafer for active layer when an oxygen ion implanted layer is removed by repetition of oxidation treatment and HF treatment.

Heretofore, an HF treatment, a polishing process, an etching process, a thermal oxidation or a combination thereof has been applied as a removal method. In FIGS. 3(a) and 3(b) are shown surface natures of the wafer for active layer when the oxygen ion implanted layer is removed by the HF treatment and (thermal oxidation→HF treatment), respectively. As shown in FIG. 3(a), it is difficult to completely remove the oxygen ion implanted layer by the HF treatment. On the other hand, when (thermal oxidation→HF treatment) is used as shown in FIG. 3(b), the oxygen ion implanted layer can be completely removed, but the TopSi layer is also attacked to increase the scattering in the thickness of TopSi layer.

On the contrary, when the oxidation treatment with an oxidizing solution such as ozone water or the like and the HF treatment with HF solution are repeatedly conducted according to the invention, only the oxygen ion implanted layer can be effectively removed as shown in FIG. 3(c).

Figure 4:
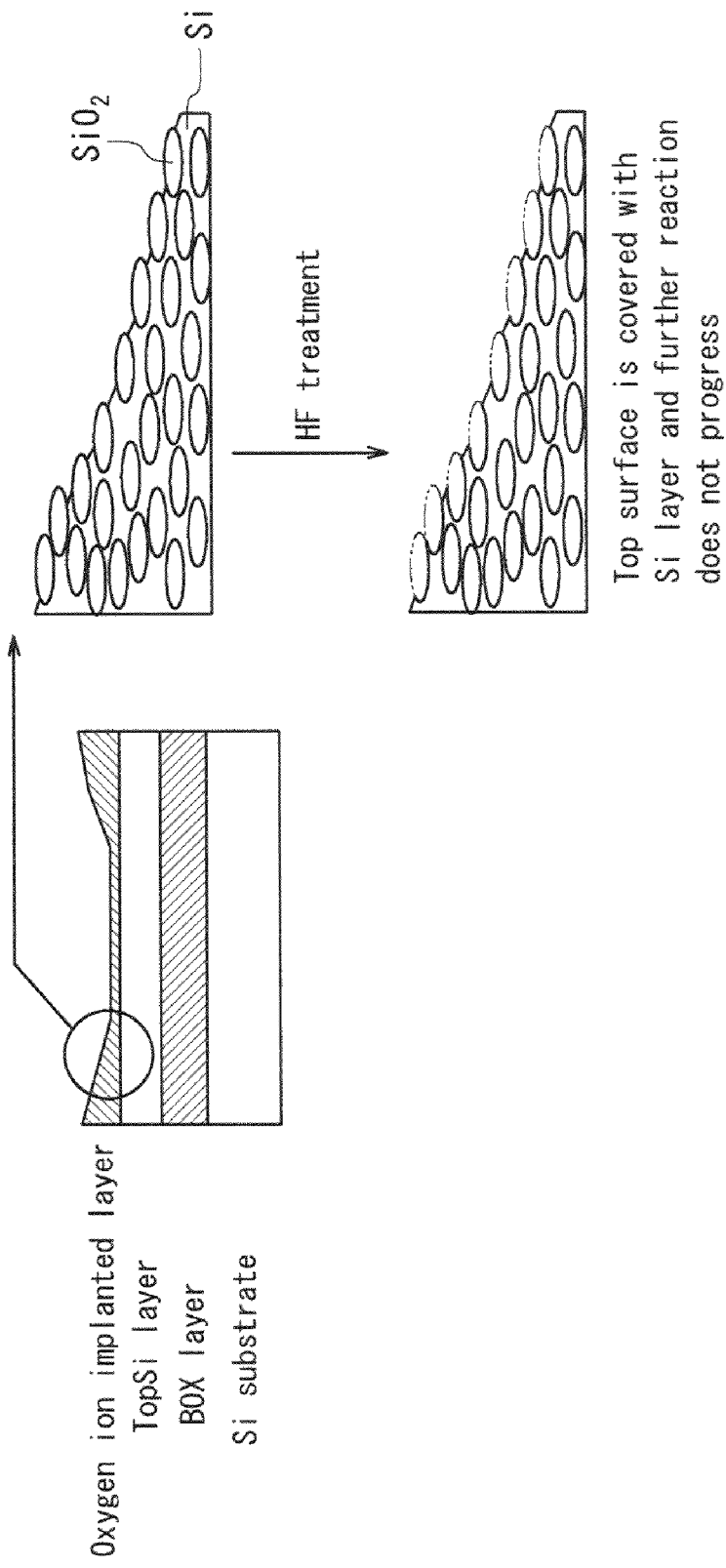
FIG. 4 is a diagrammatic view explaining a reason why an oxygen ion implanted layer can not be completely removed by HF treatment.

The reason why the oxygen ion implanted layer can not be completely removed by the HF treatment will be described with reference to FIG. 4. That is, when the surface of the wafer having the oxygen ion implanted layer left thereon is subjected to the HF treatment, the top surface layer is covered with Si layer and further reaction does not proceed.

Next, the reason why the scattering in the thickness of the TopSi layer is increased by (thermal oxidation→HF treatment) though the oxygen ion implanted layer can be removed completely will be described with reference to FIG. 5. Moreover, it is noted that the oxygen ion implanted layer having a varied thickness is existent on the surface of the wafer after the grinding as shown by symbols A and B in FIG. 5.

First of all, supposed that the oxygen ion implanted layer is a 100% Si layer, both A portion and B portion are removed by the same thickness (ta=tb) as shown in FIG. 5(a). As a result, the scattering in the thickness on the surface remains as it is.

On the one hand, supposed that the oxygen ion implanted layer is a 100% $SiO_2$ layer, as shown in FIG. 5(c), Si layer under a portion of $SiO_2$ layer having a thinner thickness is oxidized easily (ta<tb), and hence the scattering in the thickness on the surface rather increases.

On the other hand, when the oxygen ion implanted layer is a layer mixed with Si and $SiO_2$, as shown in FIG. 5(b), Si layer under a portion of the mixed layer having a thinner thickness is oxidized easily (ta≦tb), and hence the scattering in the thickness on the surface tends to increase though the degree is less as compared with the case of FIG. 5(c).

On the contrary, when the oxidation treatment and the HF treatment are repeatedly conducted according to the invention, the oxygen ion implanted layer can be effectively removed and the surface irregularity is mitigated, which are thought as follows.

FIG. 6 shows the above thinking. When the HF treatment is first conducted, $SiO_2$ particles are removed, but if the top surface layer is covered with Si layer, further reaction does not proceed. However, when the oxidation treatment, for example, an ozone oxidation treatment is conducted next, the Si layer is oxidized by ozone water to form an $SiO_2$ layer. That is, this $SiO_2$ layer is removed by the subsequent HF treatment. Therefore, when these treatments are repeated, the thickness in the portion of the ion implanted layer having a thick residual thickness is reduced by proportion corresponding to the repetitive number of the oxidation treatment and HF treatment, while a layer under the portion of the ion implanted layer having a thin residual thickness is Si layer after the removal of the ion implanted layer, which does not cause further reaction by the HF treatment. As a result, the portion of the ion implanted layer reducing the thickness is only a portion oxidized by the ozone oxidation treatment, so that the scattering in the thickness on the surface is mitigated by repeatedly conducting the oxidation treatment and the HF treatment.

Figure 7:
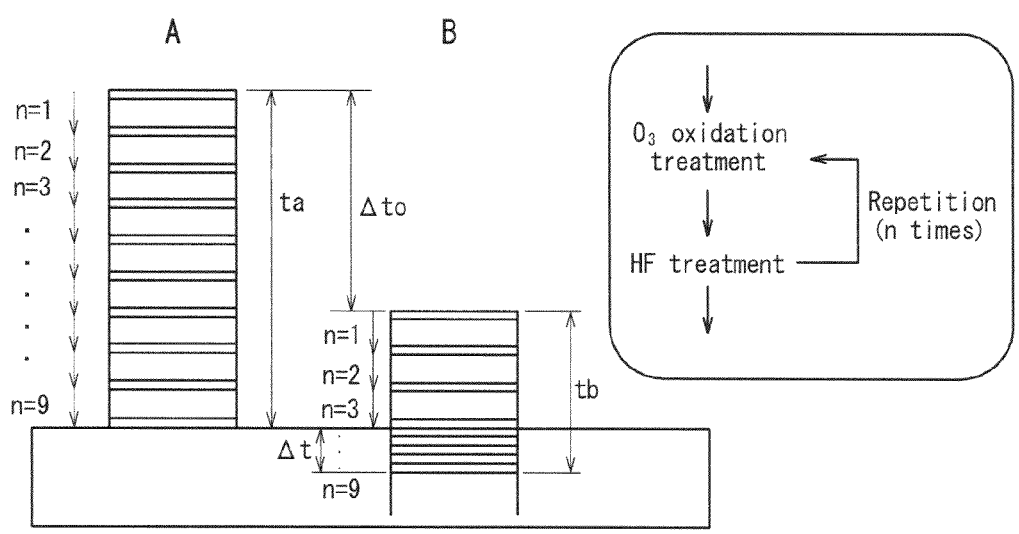
FIG. 7 is another diagrammatic view explaining a reason why an oxygen ion implanted layer can be effectively removed and a surface irregularity is mitigated by repetition of oxidation treatment and HF treatment.

This can be also explained from the thinking shown in FIG. 7. In this case, ozone oxidation treatment and HF treatment are alternately conducted 9 times.

Considering the set of ozone oxidation treatment and HF treatment as 1 set, the thickness to be removed by the repetitive treatments is same at both a portion of the ion implanted layer having a thick residual film thickness (A) and a portion having a thin residual film thickness (B) up to the first 3 sets. When the HF treatment is conducted after the ozone oxidation treatment in 4th set, the thickness is similarly reduced at the portion A, but there is no reduction of the thickness at the portion B. Such a phenomenon continues from 5th set to 9th set. Thus, the reduction of the thickness by 4th or later set of repetitive treatment proceeds in the portion A having the thick residual film thickness, while the reduction of the thickness in the portion B having the thin residual film thickness proceeds only by a thickness ratio oxidized by the ozone oxidation treatment, and as a result, the scattering in the thickness is mitigated.

In the invention, therefore, the oxygen ion implanted layer is removed by the repetitive treatment with the oxidizing solution and HF solution.

Moreover, the oxidizing solution is not particularly limited as long as it can oxidize Si as seen from FIG. 6, and ozone water and nitric acid are more preferable. At this moment, it is preferable that the concentration of ozone water is about 5 to 30 ppm, and the concentration of nitric acid is about 0.5 to 5%. On the other hand, the concentration of HF solution is preferable to be about 0.5 to 20%.

Also, either a batch type or a sheet-feed type cleaning device may be used to conduct repetitive treatment with the oxidizing solution and the HF solution.

(5) Step of Planarizing and/or Thinning Surface of Wafer for Active Layer

The surface of the bonded wafer after the removal of the oxygen ion implanted layer is necessary to be planarized because it is somewhat rough as compared with the mirror polishing. Also, the thinning treatment is conducted, if necessary.

As the planarization and/or thinning methods are applicable a polishing process, a heat treatment in a reducing atmosphere, a gas etching with a gas, ion or a radical capable of etching Si, and so on.

Polishing Process

The bonding surface is slightly polished to improve the roughness. The polishing margin is preferable to be about 10 to 500 nm. When it is less than 10 nm, the roughness cannot be sufficiently improved, while when it exceeds 500 nm, the thickness uniformity of the active layer is deteriorated. By this treatment can be rendered the surface roughness (RMS) into not more than 0.5 nm.

Heat Treatment in Reducing Atmosphere

The surface roughness of the bonded wafer is improved by heat treating in Ar, $H_2$ or a mixed atmosphere thereof The heat treating temperature is preferable to be not lower than 1000° C. but not higher than 1300° C. As to the heat-treating time, a longer time is required at a lower temperature, but it is preferable that the time is about 1 to 2 hours at 1000 to 1200° C., about 10 to 30 minutes at 1200 to 1250° C. and about 1 to 5 minutes at 1250° C. or above. If the heat treatment is conducted under conditions of higher temperature and longer time exceeding the above values, there is a fear of deteriorating the in-plane thickness uniformity of the active layer due to the etching action of the reducing atmosphere.

As a heat-treating furnace are preferable a resistance heating type vertical furnace capable of simultaneously treating plural wafers, a lamp heating type RTA (high-speed temperature rising-descending furnace) treating individual wafers, and so on. Particularly, RTA is effective in the treatment above 1200° C.

By the above heat treatment, the surface roughness (RMS) can be rendered into not more than 0.5 nm likewise the polishing process.

The removal of the oxide film generated on the surface by this heat treatment may be attained by cleaning with HF solution or by etching through annealing with a hydrogen gas, Ar gas or a gas containing HF.

Thus, there can be obtained a bonded wafer being excellent in the thickness uniformity of TopSi layer (SOI layer) and less in the defects and having dramatically improved surface roughness.

According to the invention, it is also possible to prepare a bonded wafer by directly bonding silicon wafers having different crystal orientations to each other (e.g. bonding of 110 crystal and 100 crystal, bonding of 111 crystal and 100 crystal, or the like).

Example 1

There are provided two silicon wafers of 300 mm in diameter sliced from a silicon ingot grown by CZ method and doped with boron. Both of the two wafers have a crystal orientation of (100) and are p-type having a specific resistance of 1 to 10 Ωcm. One of the two silicon wafers is used as a wafer for active layer, and this (100) wafer is treated in an oxidizing atmosphere at 1000° C. for 5 hours to form an oxide film having a thickness of 150 nm.

Then, an oxygen ion implantation is carried out from the surface of the (100) wafer in two stages at an acceleration voltage of 200 keV. The first oxygen ion implantation is conducted under conditions of substrate temperature: 200 to 600° C. and doset: $1 \times 10^{16}$ to $5 \times 10^{17}$ atoms/cm$^2$. The second oxygen ion implantation is conducted under conditions of substrate temperature: room temperature to 300° C. and dose: $1 \times 10^{15}$ to $1 \times 10^{6}$ atoms/cm$^2$. As a result, an oxygen ion implanted layer is formed at a depth position of about 400 nm from the surface of the wafer for active layer.

Next, both the wafers are subjected to cleaning with HF and ozone to remove particles from the surface to be bonded and then bonded to each other.

Thereafter, a heat treatment is conducted for strongly bonding the wafers at a bonding interface. The heat-treating condition is 1100 to 1350° C. in an oxidizing gas atmosphere for about 2 hours. Thereby, an oxide film having a thickness of 300 to 500 nm is formed on both surfaces of the bonded wafer, which serves as a backside protection film during subsequent processing.

Then, the wafer for active layer in the bonded wafer is ground from the surface thereof by a given thickness with a grinding apparatus. That is, the grinding treatment is carried out at the front surface side of the oxygen ion implanted layer so as to leave only a part of the wafer for active layer (corresponding to a thickness of about 5 to 20 μm). The in-plane scattering of the thickness in the residual Si layer is ±10%.

Subsequently, the polish-stop is conducted so as to expose the oxide ion implanted layer. As the polishing agent is used an alkaline solution having an abrasive concentration of not more than 1 mass %. The alkaline solution is an organic alkali solution composed mainly of amine (e.g. piperazine, ethylene diamine or the like).

Thereafter, the oxygen ion implanted layer is removed by repetitive treatment with an oxidizing solution and an HF solution using 10 ppm ozone water as the oxidizing solution and 5% HF solution as the HF solution in a sheet-feed type cleaning device.

For the comparison, the treatment for removing the oxygen ion implanted layer is conducted by thermal oxidation (1000° C., 10 hr, 250 nm)+HF treatment (45%) according to the conventional method.

The thickness distribution of TopSi layer after the above treatment for removing the oxygen ion implanted layer is measured by a spectroscopic ellipsometry to evaluate the thickness uniformity with the calculation of (maximum film thickness−minimum film thickness). As a result, in case of the conventional (thermal oxidation+HF treatment), the value of maximum film thickness−minimum film thickness=7 nm, while in case of repetitive treatment with ozone water and HF solution according to the invention, the value of maximum film thickness−minimum film thickness=3 nm. Thus, the thickness uniformity is dramatically improved in the invention.

Thereafter, the surface of the bonded wafer is cleaned and then heat-treated in an argon gas atmosphere at 1100° C. for 2 hours to planarize the wafer surface. Then, the wafer is thinned by wet atmosphere (1100° C., 40 min)+HF treatment (7%) to complete a bonded wafer. The thus obtained active layer has a thickness of 52 to 58 nm and the in-plane scattering in the thickness distribution is within a range of 5 to 10%.

What is claimed is:

1. A method for producing a bonded wafer by bonding a wafer for active layer to a wafer for support layer with or without an insulating film and then thinning the wafer for active layer, which comprises a series of:
   (1) a step of implanting oxygen ions into a wafer for active layer;
   (2) a step of bonding the wafer for active layer to a wafer for support layer either directly without an insulating film or indirectly with an insulating film;
   (3) a step of thinning the wafer for active layer in the bonded wafer to expose the oxygen ion implanted layer;
   (4) a step of removing the oxygen ion implanted layer in the wafer for active layer, and
   (5) a step of planarizing and/or thinning the surface of the wafer for active layer by heat treatment and/or polishing,
   wherein the oxygen ion implanted layer is removed by repetitive treatment with an oxidizing solution and an HF solution in the above step (4).

2. The method for producing a bonded wafer according to claim 1, wherein the oxidizing solution is ozone water or nitric acid.

3. The method for producing a bonded wafer according to claim 1, wherein a crystal orientation of each wafer face in the bonded wafer is a combination of (100) and (110) or (111).

4. The method for producing a bonded wafer according to claim 2, wherein a crystal orientation of each wafer face in the bonded wafer is a combination of (100) and (110) or (111).

* * * * *